United States Patent
Janik

(10) Patent No.: US 10,511,169 B2
(45) Date of Patent: Dec. 17, 2019

(54) SYSTEM AND METHOD FOR A DYNAMIC SWITCHABLE ACTIVE FRONT END—DYNAMIC SWITCHABLE ACTIVE HARMONIC FILTERING SYSTEM

(71) Applicant: John Bradford Janik, Houston, TX (US)

(72) Inventor: John Bradford Janik, Houston, TX (US)

(73) Assignee: Electronic Power Design, Inc., Houston, TX (US)

( * ) Notice: Subject to any disclaimer, the term of this patent is extended or adjusted under 35 U.S.C. 154(b) by 318 days.

(21) Appl. No.: 15/437,160

(22) Filed: Feb. 20, 2017

(65) Prior Publication Data

US 2017/0302075 A1   Oct. 19, 2017

Related U.S. Application Data

(60) Provisional application No. 62/297,836, filed on Feb. 20, 2016.

(51) Int. Cl.
*H02J 3/01* (2006.01)
*E21B 41/00* (2006.01)
*H02J 3/14* (2006.01)
*G01R 23/20* (2006.01)
*G05B 15/02* (2006.01)

(52) U.S. Cl.
CPC .......... *H02J 3/01* (2013.01); *E21B 41/00* (2013.01); *E21B 41/0092* (2013.01); *G01R 23/20* (2013.01); *G05B 15/02* (2013.01); *H02J 3/14* (2013.01); *Y02B 70/3225* (2013.01); *Y02E 40/40* (2013.01); *Y04S 20/222* (2013.01)

(58) Field of Classification Search
CPC .... H02J 3/01; H02J 3/14; E21B 41/00; E21B 41/0092; G01R 23/20; G05B 15/02; Y02B 70/3225; Y02E 40/40; Y04S 20/222
USPC ......................................................... 700/292
See application file for complete search history.

(56) References Cited

U.S. PATENT DOCUMENTS

| | | | |
|---|---|---|---|
| 2006/0214509 A1* | 9/2006 | Dai ........................... | H02J 3/38 307/11 |
| 2014/0077607 A1* | 3/2014 | Clarke ..................... | H02J 3/005 307/75 |
| 2014/0268953 A1* | 9/2014 | Patel ..................... | H02M 7/217 363/89 |

* cited by examiner

Primary Examiner — Robert E Fennema
Assistant Examiner — Jigneshkumar C Patel
(74) Attorney, Agent, or Firm — G. Michael Roebuck, PC

(57) ABSTRACT

A System and Method for a Dynamic Switchable Active Front End—Dynamic Switchable Active Harmonic Filtering System is disclosed.

12 Claims, 4 Drawing Sheets

SYSTEM AND METHOD FOR A DYNAMIC SWITCHABLE ACTIVE FRONT END—DYNAMIC SWITCHABLE ACTIVE HARMONIC FILTERING SYSTEM

CROSS REFERENCE TO RELATED APPLICATIONS

This patent application claims priority from U.S. Provisional Patent Application 62/297,296 by John B. Janik entitled "System and Method for a Dynamic Switchable Active Front End—Dynamic Switchable Active Harmonic Filtering System" filed on Feb. 20, 2016, and claims priority from U.S. patent application Ser. No. 14/558,489 filed on Dec. 2, 2014, now U.S. Pat. No. 9,365,265 by John B. Janik, issued on May 25, 2016 and entitled "Hybrid Winch with Controlled Release and Torque Impulse Generation" and claims priority from U.S. Provisional Patent Application No. 62/297,636 filed on Feb. 19, 2016 by John B. Janik entitled SYSTEM AND METHOD FOR HYBRID POWER GENERATION, all of which are hereby incorporated by reference herein in their entirety.

BACKGROUND OF THE INVENTION

Oil rigs have diverse power requirements. Multiple frequencies and multiple alternating current (AC) and direct current (DC) power levels are distributed among various electrical equipment on the oil rig.

FIELD OF THE INVENTION

The present invention relates to power management on an oil rig and in particular to active filtering of power to an oil rig.

SUMMARY OF THE INVENTION

In a particular illustrative embodiment A Dynamic Switchable Active Front End (DSAFE)/Dynamic Switchable Active Harmonic Filtering (DSAHF) System is provided wherein a Dynamic Switchable Active Harmonic Filter (DSAHF) is integrated into a Dynamic Switch Active Front End (DSAFE) (hereinafter referred to DSAFE/DSAHF).

DETAILED DESCRIPTION OF THE INVENTION

AC drive operation produces harmonic currents, which can have a number of detrimental effects on system performance. A system and method are disclosed that provide Active Harmonic Filters and Active Front End drives are used to limit the effects of these harmonic currents generated by loads that are supplied power through an of active front end drive using power from an alternating current (AC) power source.

Loads such as AC inverter drives that drive pumps generate harmonic currents that have a detrimental effect on the performance and reliability of other equipment that are electrically connected on the power bus and distort the applied voltage. Power companies that provide AC power to drilling installations companies require limits on harmonics exported to the AC power grid powering the loads on an oil rig.

Companies using the AC power grid have used AFEs to reduce harmonics. The harmonic currents due to AFE bridge switching can be reduced by the Harmonic filers that are provided to reduce the effects of the harmonic currents generated by the AFE supplying power to a load. If the AFE fails, the drive is down until it is repaired. AFE drives and standard 6 pulse AC PWM drives can interact when connected to the same bus. The harmonic currents from the AFE drive force up the DC bus voltage on the standard drives that risks of tripping the 6 pulse drive(s) due to over-voltage.

Figure 1:
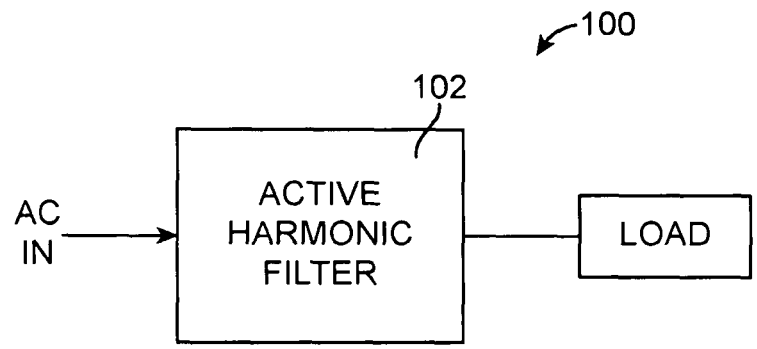
FIG. 1 depicts a prior art Active Front End.
Figure 2:
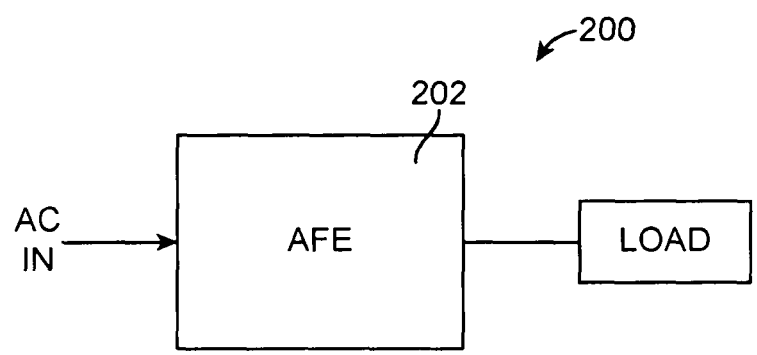
FIG. 2 depicts a prior art Active Harmonic Filter.

Turning now to FIG. 1, Active Harmonic Filters (AHF) are well known in the art. AHFs have been used to clean up harmonic electrical noise generated by a load to reduce noise transferred back to the AC grid and to other loads or equipment attached to the AC grid. Numerous patents and technical articles describe such use AHFs that are commercially available currently in the United States. Turning now to FIG. 2, Active Front Ends (AFE) are well known in the art. AFEs have been used to clean up AC power grid supplied loads or equipment attached to the AC. Numerous patents and technical articles describe AFEs that are commercially available currently in the United States.

Figure 3:
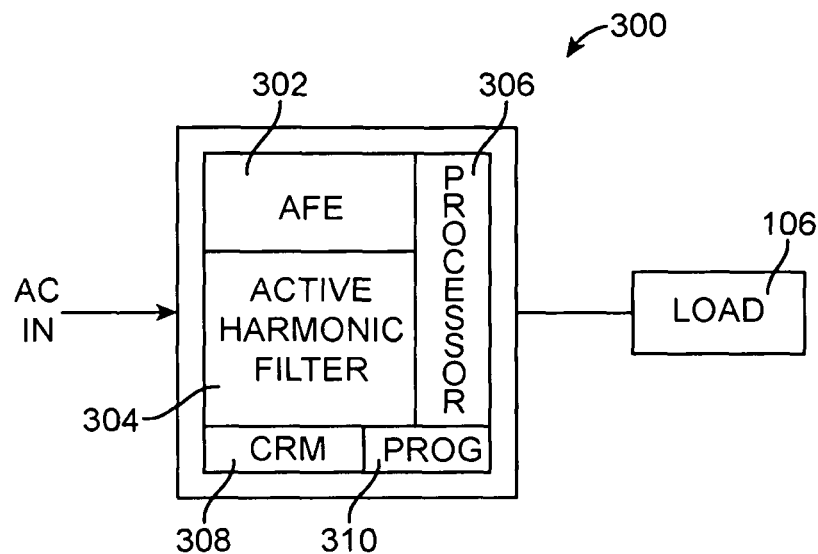
FIG. 3 depicts a combined Dynamic Switchable AHF/ Dynamic Switchable AFE in particular illustrative embodiment of the invention.

Turning now to FIG. 3, in a particular illustrative embodiment of the invention 300 of the invention a combination a discrete AHF 302 is combined with a processor 306 to form a Dynamic Switchable AHF 304 (DSAHF) and a discrete AFE 304 is combined with the processor 306 to form a Dynamic Switchable AFE 302 (DSAFE) are provided. The processor 306 is provided to control the combination of the discrete Dynamic Switchable AHF and the discrete Dynamic Switchable AFE. The processor is digitally connected to a non-transitory computer readable medium 308. A computer program 310 is stored in the computer readable medium. The computer program includes but is not limited instructions are executed by the processor to control the DSAHF and the DSAFE.

Figure 4:
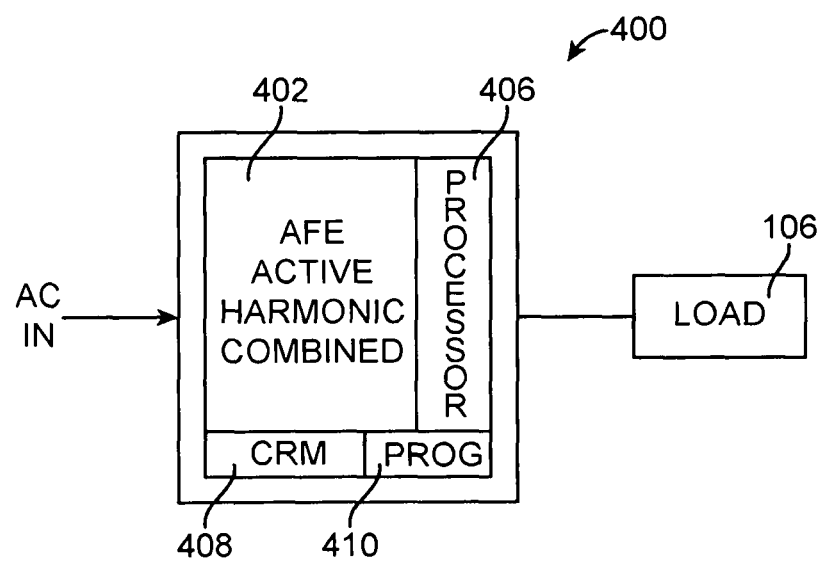
FIG. 4 depicts an integrated Dynamic Switchable AHF/ Dynamic Switchable AFE in particular illustrative embodiment of the invention.

Turning now to FIG. 4, in another particular illustrative embodiment of the invention 400 of the invention an integrated DSAHF/DSAFE 402 is provided. The integrated DSAHF/DSAFE shares the same hardware between the DSAHF/DSAFE. The processor determines how the shared DSAHF/DSAFE hardware is used. In a particular illustrative embodiment, the computer program determines whether the shared DSAHF/DSAFE hardware in the integrated DSAHF/ DSAFE acts as a 1) DSAHF or 2) an DSAFE or 3) both an DSAHF and an DSAFE at the same time. A processor 406 is provided to control the integrated DSAHF/DSAFE hardware. The processor is digitally connected to a non-transitory computer readable medium 408. A computer program 410 is stored in the computer readable medium. The computer program includes but is not limited instructions are executed by the processor to control the integrated DSAHF/ DSAFE.

Figure 5:
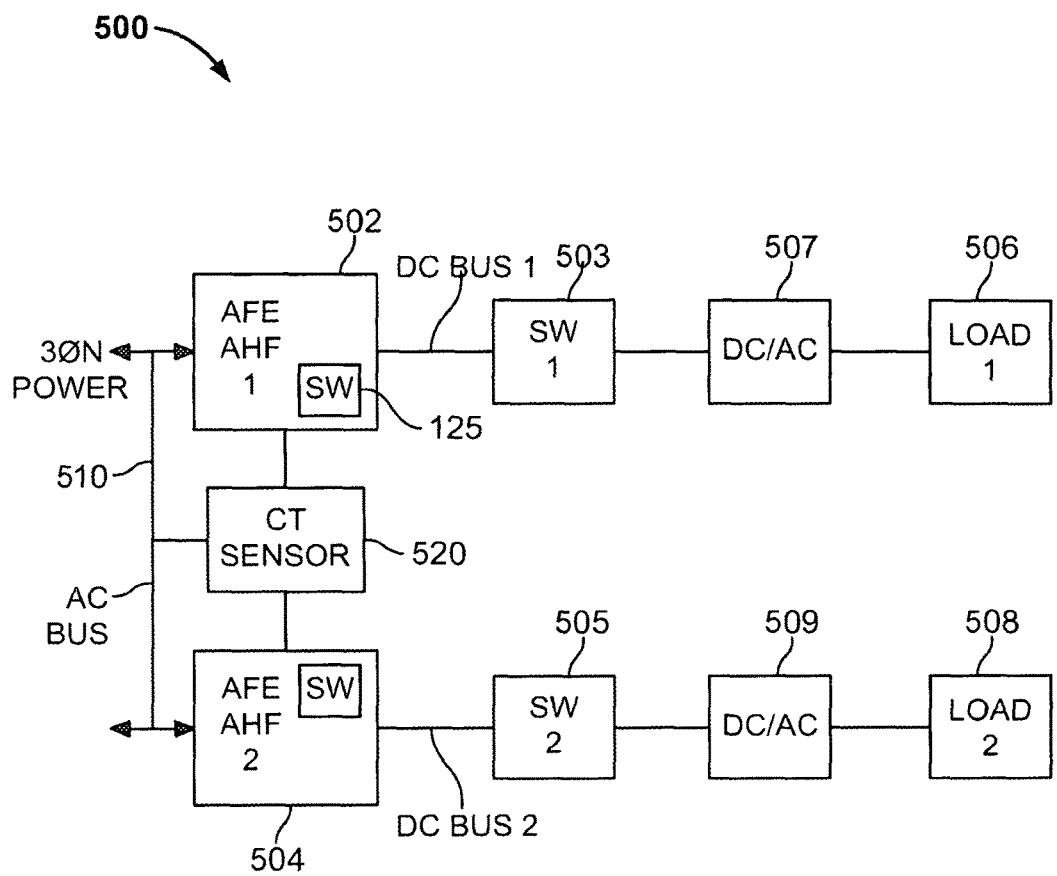
FIG. 5 depicts a schematic system block diagram for a particular illustrative embodiment of the invention.

Oil rigs have diverse power requirements. Multiple frequencies and multiple alternating current (AC) and direct current (DC) power levels are distributed among various electrical equipment on the oil rig. Turning now to FIG. 5, in a particular illustrative embodiment of the invention, an integrated Dynamic Switchable Active Front End (DSAFE)/Dynamic Switchable Active Harmonic Filtering (DSAHF) System 500 is provided wherein a Dynamic Switchable Active Harmonic Filter (DSAHF) is integrated into a Dynamic Switch Active Front End (DSAFE) (hereinafter referred to DSAFE/DSAHF) 502. In a particular embodiment the Dynamic Switchable Active Front End/Dynamic Active Harmonic Filtering System 500 provides a plurality of integrated DSAFE/DSAHF's 502, 504 wherein each one of the plurality of DSAFE/DSAHF's provides power to at least one particular equipment on the oil rig. In an illustrative embodiment, a first DSAFE/DSAHF 502 acts as a DSAFE that provides power to a first equipment representing a first load 506 on the oil rig. A second DSAFE/DSAHF 504 provides power to a second equipment representing a second load 508 on the oil rig. A common three phase AC power bus 510 provides power to the plurality of DSAFE/DSAHF's 502 and 504.

In a particular illustrative embodiment each of the DSAFEs is connected in series with the AC power bus and each of the DSAHFs is connected in parallel with the AC power bus.

The first DSAFE/DSAHF 502 acts as a DSAFE while providing power to a first equipment having a first load 506 during duty cycle when a load is on, providing power to a first oil rig equipment, such as a draw works (Load 1 506). The second DSAFE/DSAHF 504 acts as a DSAFE while providing power to a load during duty cycle when the second equipment having a second load is on, providing power to the second oil rig equipment (Load 2 508). When the first equipment having the first load 506 is not active, the first DSAFE/DSAHF senses that absence of the first load 506 and removes first load one from a first DC Bus providing DC power from the DSAFE. In a particular illustrative embodiment a capacitor is switched serially into the first DC Bus to remove Load 1 from the first DSAFE/DSAHF. The first DSAFE/DSAHF is then switched to act as a DSAHF to provide active filtering on AC power bus providing to the oil rig. The first DSAFE/DSAHF acting as a DSAHF senses harmonic distortion using a Current Transformer on the common AC Bus, generates anti-harmonic currents and injects the generated anti-harmonic currents on to the AC Bus to cancel the harmonic currents in the AC Power supplied to the second DSAFE/DSAHF.

Turning now to FIG. 5, FIG. 5 is a block diagram schematic depiction of an illustrative embodiment of a Dynamic Switchable Active Front End (DSAFE)/Dynamic Switchable Active Harmonic Filtering (DSAHF) System 500 wherein a Dynamic Switchable Active Harmonic Filter (DSAHF) is integrated into a Dynamic Switch Active Front End (DSAFE) 502 (hereinafter referred to DSAFE/DSAHF). In a particular embodiment the Dynamic Switchable Active Front End/Dynamic Active Harmonic Filtering System provides a plurality of DSAFE/DSAHF's 502 and 504 wherein each one of the plurality of DSAFE/DSAHF's provides power to at least one a particular equipment, Load 506 or Load 508 on the oil rig. In an illustrative embodiment, a first DSAFE/DSAHF 502 acts as a DSAFE that provides power to a first equipment load 506 representing a first load 506 on the oil rig. A second DSAFE/DSAHF 504 provides power to a second equipment 508 representing a second load 508 on the oil rig. A common three phase AC power bus 510 provides power to the plurality of DSAFE/DSAHF's.

The first integrated DSAFE/DSAHFS 502 acts as a DSAFE while providing power to the first equipment having a first load during the duty cycle when the first equipment representing Load 1 506 is on, providing power to a first oil rig equipment, such as a draw works (Load 1). The second DSAFE/DSAHFS 504 acts as a DSAFE while providing power to a load during an on duty cycle when the second equipment having a second load, Load 2 508 is on, providing power to the second oil rig equipment (Load 2). The Processor 506 on the DSAFE/DSAHFS 502 determines a "not active" status from the first equipment having the first load is not active. A Computer Program on Processor 506 on the first DSAFE/DSAHF senses that absence of the first load and removes first load one from a first DC Bus providing DC power from the DSAFE. In a particular illustrative embodiment the processor commands switch 503 to switch a capacitor serially into the first DC Bus to remove Load 1 from the first DSAFE/DSAHF 502. Any known switching apparatus can be used to interrupt to the connection on the DC Bus between the first DSAFE/DSAHF 502 and Load 1 506. The Computer Program on Processor 506 on the first DSAFE/DSAHF then switches the first DSAFE/DSAHF to act as a DSAHF to provide active filtering on AC power bus providing to the oil rig. The Computer Program on Processor 125 on the first DSAFE/DSAHF senses harmonic distortion on the common AC Bus 510 using a Current Transformer 520, generates anti-harmonic currents and injects the generated anti-harmonic currents on to the AC Bus 510 to cancel the harmonic currents in the AC Power supplied to the second DSAFE/DSAHF 504.

Figure 6:
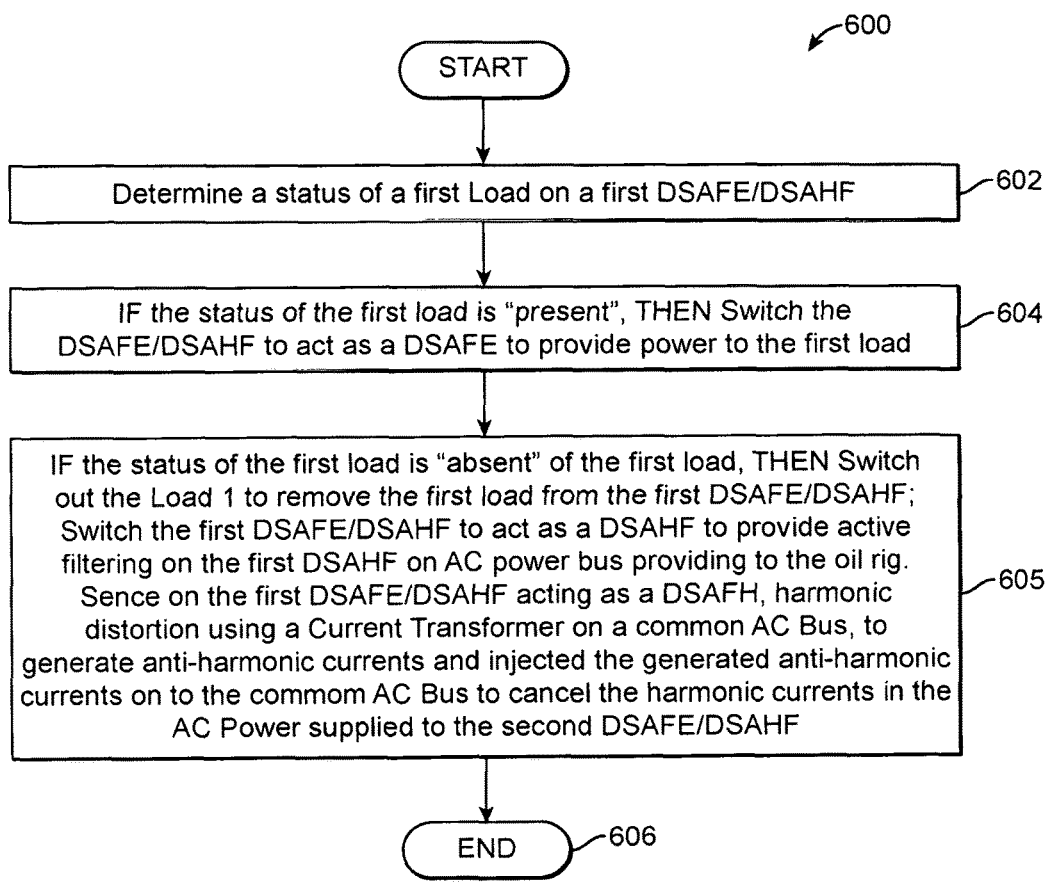
FIG. 6 depicts a flow charts for operations for a particular illustrative embodiment of the invention.

Turning now to FIG. 6, a flow chart of operations performed by the processor executing the computer program from computer readable memory is depicted. A DSAFE/DSAHF Computer Processor 125 is provided integrated into at least one of the integrated DSAFE/DSAHF's provided by the Dynamic Switchable Active Front End/Dynamic Active Harmonic Filtering System. A computer program stored in a computer readable medium attached to processor 125. The computer program 600 includes but is not limited to instructions that are executed by the DSAFE/DSAHF Computer Processor. In a particular embodiment, the computer program includes but is not limited to instructions to: Determine a status of a first Load on a first DSAFE/DSAHF as shown in block 602; When the status of the first load is "present", Switch the DSAFE/DSAHF to act as a DSAFE to provide power to the first load as shown in block 604; When the status of the first load is "absent" of the first load, Switch out the Load 1 to remove the first load from the first DSAFE/DSAHF; Switch the first DSAFE/DSAHF to act as a DSAHF to provide active filtering on the first DSAHF on AC power bus providing to the oil rig. Sense on the first DSAFE/DSAHF acting as a DSAHF, harmonic distortion using a Current Transformer on a common AC Bus, to generate anti-harmonic currents and inject the generated anti-harmonic currents on to the common AC Bus to cancel the harmonic currents in the AC Power supplied to the second DSAFE/DSAHF as shown in block 605.

The present invention can be realized in hardware, software, or a combination of hardware and software. In a specific embodiment, a system according to the present inventions can be realized in a centralized fashion in one computer system, or in a distributed fashion where different elements are spread across several interconnected computer systems. Any kind of computer system or other apparatus adapted for carrying out the methods and inventions described herein may be used for purposes of the present inventions. A typical combination of hardware and software could be a general purpose computer system with a computer program that, when being loaded and executed, controls the computer system such that it carries out the methods and inventions described herein.

The figures herein include block diagram and flowchart illustrations of methods, apparatus(es) and computer program products according to various embodiments of the present inventions. It will be understood that each block in such figures, and combinations of these blocks, can be implemented by computer program instructions. These computer program instructions may be loaded onto a computer or other programmable data processing apparatus to produce a machine, such that the instructions which execute on the computer or other programmable data processing apparatus may be used to implement the functions specified in the block, blocks or flow charts. These computer program instructions may also be stored in a computer-readable medium or memory that can direct a computer or other programmable data processing apparatus to function in a particular manner, such that the instructions stored in the computer-readable medium or memory produce an article of manufacture including instructions which may implement the function specified in the block, blocks or flow charts. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the block, blocks or flow charts.

Those skilled in the art should readily appreciate that programs defining the functions of the present inventions can be delivered to a computer in many forms, including but not limited to: (a) information permanently stored on non-writable storage media (e.g., read only memory devices within a computer such as ROM or CD-ROM disks readable by a computer I/O attachment); (b) information alterably stored on writable storage media (e.g., floppy disks and hard drives); or (c) information conveyed to a computer through communication media for example using wireless, baseband signaling or broadband signaling techniques, including carrier wave signaling techniques, such as over computer or telephone networks via a modem, or via any of networks.

The term "executable" as used herein means that a program file is of the type that may be run by the Processor 125. In specific embodiments, examples of executable programs may include without limitation: a compiled program that can be translated into machine code in a format that can be loaded into a random access portion of the Computer Readable Medium and run by the Processor 125; source code that may be expressed in proper format such as object code that is capable of being loaded into a random access portion of the Computer Readable Medium and executed by the Processor 125; or source code that may be interpreted by another executable program to generate instructions in a random access portion of the Computer Readable Medium to be executed by the Processor 125. An executable program may be stored in any portion or component of the Computer Readable Medium including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The Computer Readable Medium may include both volatile and nonvolatile memory and data storage components. Volatile components are those that do not retain data values upon loss of power. Nonvolatile components are those that retain data upon a loss of power. Thus, the Computer Readable Medium may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

In a specific embodiment, the Processor may represent multiple Processors and/or multiple processor cores and the Computer Readable Medium may represent multiple Computer Readable Mediums that operate in parallel processing circuits, respectively. In such a case, the local interface may be an appropriate network that facilitates communication between any two of the multiple Processors, between any processor and any of the Computer Readable Medium, or between any two of the Computer Readable Mediums, etc. The local interface may comprise additional systems designed to coordinate this communication, including, for example, performing load balancing. The Load Sharing Processor may be of electrical or of some other available construction.

Although the programs and other various systems, components and functionalities described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits (ASICs) having appropriate logic gates, field-programmable gate arrays (FPGAs), or other components. Such technologies are generally well known by those skilled in the art and, consequently, are not described in detail herein.

Flowcharts and Block Diagrams of Figures show the functionality and operation of various specific embodiments of certain aspects of the present inventions. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a Load Sharing Processor in a computer system or other system. The machine code may be converted from the source code, etc. If embodied in hardware, each block may represent a circuit or a number of interconnected circuits to implement the specified logical function(s).

Although flowcharts and block diagrams shown herein show a specific order of execution, it is understood that the order of execution may differ from that which is depicted. For example, the order of execution of two or more blocks may be scrambled relative to the order shown. Also, two or more blocks shown in succession in FIG. 1 may be executed concurrently or with partial concurrence. Further, in some embodiments, one or more of the blocks shown in FIG. 1 may be skipped or omitted. In addition, any number of counters, state variables, warning semaphores, or messages might be added to the logical flow described herein, for purposes of enhanced utility, accounting, performance measurement, or providing troubleshooting aids. It is understood that all such variations are within the scope of the present inventions.

Any logic or application described herein that comprises software or code can be embodied in any non-transitory computer-readable medium, such as computer-readable medium, for use by or in connection with an instruction execution system such as, for example, a Load Sharing Processor in a computer system or other system. In this sense, the logic may comprise, for example, statements including instructions and declarations that can be fetched from the computer-readable medium and executed by the instruction execution system. In the context of the present inventions, a "computer-readable medium" may include any medium that may contain, store, or maintain the logic or application described herein for use by or in connection with the instruction execution system.

The computer-readable medium may comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

The Load Sharing Processor may further include a network interface coupled to the bus and in communication with the network. The network interface may be configured to allow data to be exchanged between computer and other devices attached to the network or any other network or between nodes of any computer system or the video system. In addition to the above description of the network, it may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, the network interface 159 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

The Load Sharing Processor may also include an input/output interface coupled to the bus and also coupled to one or more input/output devices, such as a display, a touchscreen, a mouse or other cursor control device, and/or a keyboard. In certain specific embodiments, further examples of input/output devices may include one or more display terminals, keypads, touchpads, scanning devices, voice or optical recognition devices, or any other devices suitable for entering or accessing data by one or more computers. Multiple input/output devices may be present with respect to a computer or may be distributed on various nodes of computer system, the system and/or any of the viewing or other devices shown in FIG. 1. In some embodiments, similar input/output devices may be separate from the Load Sharing Processor and may interact with the Load Sharing Processor or one or more nodes of computer system through a wired or wireless connection, such as through the network interface.

It is to be understood that the inventions disclosed herein are not limited to the exact details of construction, operation, exact materials or embodiments shown and described. Although specific embodiments of the inventions have been described, various modifications, alterations, alternative constructions, and equivalents are also encompassed within the scope of the inventions. Although the present inventions may have been described using a particular series of steps, it should be apparent to those skilled in the art that the scope of the present inventions is not limited to the described series of steps. The specification and drawings are, accordingly, to be regarded in an illustrative rather than a restrictive sense. It will be evident that additions, subtractions, deletions, and other modifications and changes may be made thereunto without departing from the broader spirit and scope of the inventions as set forth in the claims set forth below. Accordingly, the inventions are therefore to be limited only by the scope of the appended claims. None of the claim language should be interpreted pursuant to 35 U.S.C. 112(f) unless the word "means" is recited in any of the claim language, and then only with respect to any recited "means" limitation.

What is claimed is:

1. A system for controlling a dynamic switchable active front end (DSAFE) and dynamic switchable active harmonic filter (DSAHF) on an oil rig, comprising:
   a processor in data communication with a non-transitory computer readable medium;
   a computer program comprising computer executable instructions stored in the computer readable medium for execution by the processor, the computer program comprising:
   instructions to determine a status of a first load on a first DSAFE/DSAHF;
   instructions to when the status of the first load is "present", switch the DSAFE/DSAHF to act as a DSAFE to provide power to the first load;
   instructions to when the status of the first load is "absent" of the first load, switch out the first load to remove the first load from the first DSAFE/DSAHF;
   and instructions to switch the first DSAFE/DSAHF to act as a DSAHF to provide active filtering on the first DSAHF on alternating current (AC) power bus providing to the oil rig;
   and
   instructions to sense on the first DSAFE/DSAHF acting as a DSAHF, harmonic distortion using a current transformer on a common AC bus, generate anti-harmonic currents and inject the generated anti-harmonic currents on to the common AC bus to cancel the harmonic currents in the AC power supplied to a second DSAFE/DSAHF.

2. The system of claim 1 wherein the DSAFE/DSAHF is combination of a discrete active front end (AFE) and a discrete active harmonic filter (AHF).

3. The system of claim 1 wherein the DSAFE/DSAHF is an AFE integrated with an AHF.

4. The system of claim 3, wherein the computer program determines the operation of the integrated DSAFE/DSAHF as a DSAFE and a DSAHF.

5. The system of claim 1, the system further comprising:
an AC power grid that provides power to the DSAFE/DSAHF; and
an oil rig having equipment as load to which the DSAFE/DSAHF provides power from the AC grid to the load.

6. A non-transitory computer readable medium containing a computer program for execution by a processor, the computer program comprising:
instructions to determine a status of a first load on a first DSAFE/DSAHF;
instructions to when the status of the first load is "present", switch the DSAFE/DSAHF to act as a DSAFE to provide power to the first load;
instructions to when the status of the first load is "absent" of the first load, switch out the first load to remove the first load from the first DSAFE/DSAHF;
and instructions to switch the first DSAFE/DSAHF to act as a DSAHF to provide active filtering on the first DSAHF on AC power bus providing to the oil rig;
and
instructions to sense on the first DSAFE/DSAHF acting as a DSAHF, harmonic distortion using a current transformer on a common AC bus, generate anti-harmonic currents and inject the generated anti-harmonic currents on to the common AC bus to cancel the harmonic currents in the AC power supplied to a second DSAFE/DSAHF.

7. The medium of claim 6 wherein the DSAFE/DSAHF is combination of an AFE and an AHF.

8. The medium of claim 6 wherein the DSAFE/DSAHF is an AFE with an AHF.

9. The medium of claim 8, wherein the computer program determines the operation of the integrated DSAFE/DSAHF as a DSAFE and a DSAHF.

10. A method for controlling a dynamic switchable active front end and active harmonic filter on an oil rig, the method comprising:
determining on a processor status of a first load on a first DSAFE/DSAHF;
determining on the processor, when the status of the first load is "present" and switching the DSAFE/DSAHF to act as a DSAFE to provide power to the first load;
determining on the processor, when a status of the first load is "absent" of the first load and switching out the first load to remove the first load from the first DSAFE/DSAHF;
and instructions to switch the first DSAFE/DSAHF to act as a DSAHF to provide active filtering on the first DSAHF on AC power bus providing to the oil rig;
and
sensing on the processor, on the first DSAFE/DSAHF acting as a DSAHF, harmonic distortion using a current transformer on a common AC Bus, generate anti-harmonic currents and inject the generated anti-harmonic currents on to the common AC bus to cancel the harmonic currents in the AC power supplied to a second DSAFE/DSAHF.

11. The method of claim 10 wherein the DSAFE/DSAHF is combination of an AFE and an AHF.

12. The method of claim 10 wherein the DSAFE/DSAHF is an AFE with an AHF.

* * * * *